United States Patent
Chen et al.

(10) Patent No.: US 8,470,624 B2
(45) Date of Patent: Jun. 25, 2013

(54) FABRICATING METHOD OF ORGANIC ELECTRO-LUMINESCENCE DISPLAY UNIT

(75) Inventors: Chang-Ken Chen, Taipei County (TW); Hsing-Hung Hsieh, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/602,343

(22) Filed: Sep. 4, 2012

(65) Prior Publication Data

US 2012/0329189 A1    Dec. 27, 2012

Related U.S. Application Data

(62) Division of application No. 12/582,711, filed on Oct. 21, 2009, now Pat. No. 8,299,460.

(30) Foreign Application Priority Data

Jul. 27, 2009   (TW) ................. 98125240 A

(51) Int. Cl.
*H01L 21/00*   (2006.01)
(52) U.S. Cl.
USPC ............................. 438/34; 438/151; 257/43

(58) Field of Classification Search
USPC ............... 438/34, 151; 257/43, 72, E33.002, 257/E33.053
See application file for complete search history.

(56) References Cited

U.S. PATENT DOCUMENTS

| | | | |
|---|---|---|---|
| 2002/0109796 A1* | 8/2002 | Lin et al. | 349/43 |
| 2004/0119902 A1* | 6/2004 | Chae et al. | 349/43 |
| 2007/0228575 A1* | 10/2007 | Inoue | 257/762 |
| 2010/0155717 A1* | 6/2010 | Yano et al. | 257/43 |

* cited by examiner

*Primary Examiner* — Phuc Dang
(74) *Attorney, Agent, or Firm* — Jianq Chyun IP Office

(57) ABSTRACT

A fabricating method of an organic electroluminescent display unit is provided. A gate and a gate insulating layer covering the gate are formed on the substrate. A patterned metal-oxide layer with an etching stop layer thereon is formed on the gate insulating layer. A surface treatment is performed on the patterned metal-oxide layer with use of the etching stop layer as a mask, such that a portion of the patterned metal-oxide layer uncovered by the etching stop layer has greater conductivity than conductivity of another portion of the patterned metal-oxide layer covered by the etching stop layer. The patterned metal-oxide layer treated by the surface treatment includes a pixel electrode and an active layer located above the gate. A source and a drain are then formed. And then, an organic electro-luminescence layer and a top electrode are sequentially formed on the pixel electrode.

2 Claims, 6 Drawing Sheets

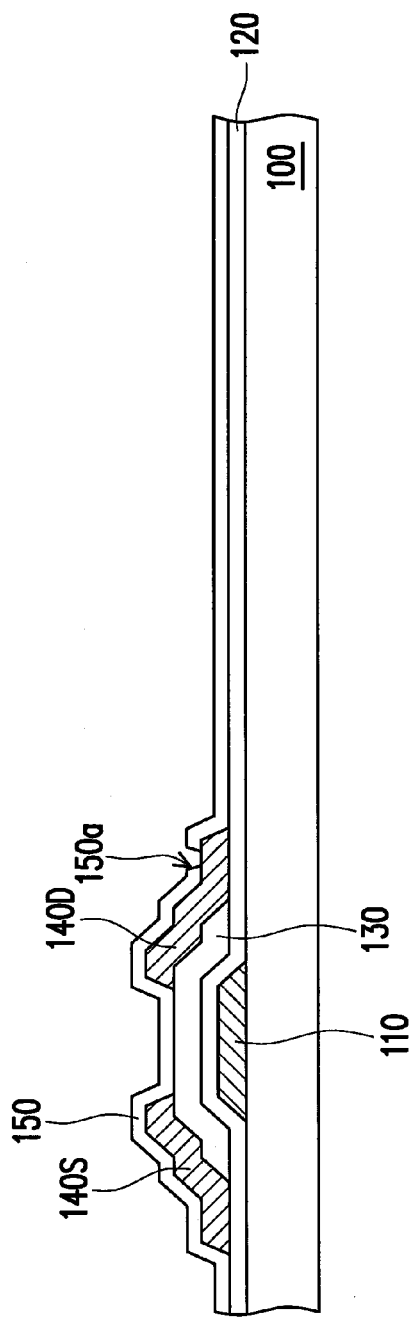
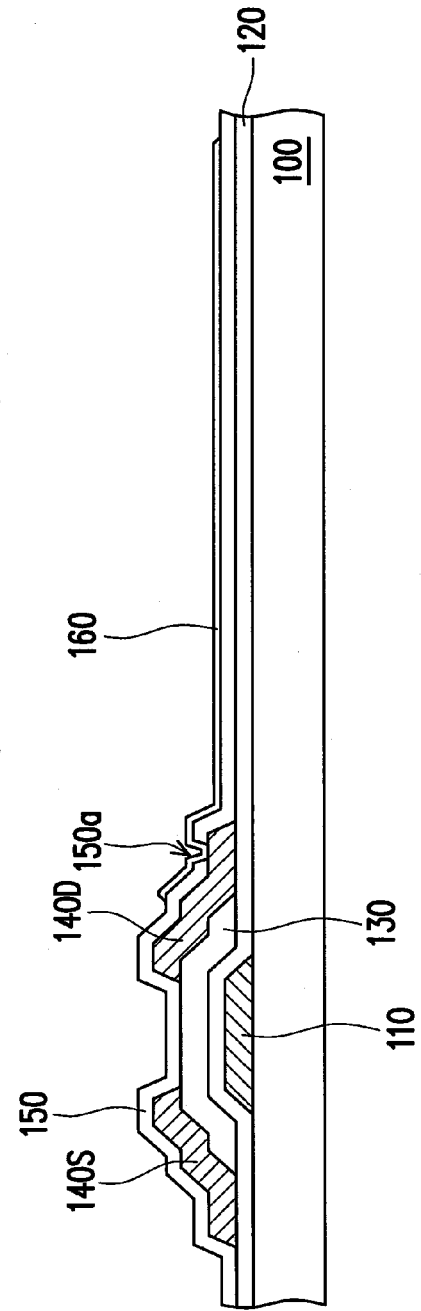
FIG. 1D (RELATED ART)
FIG. 1E (RELATED ART)

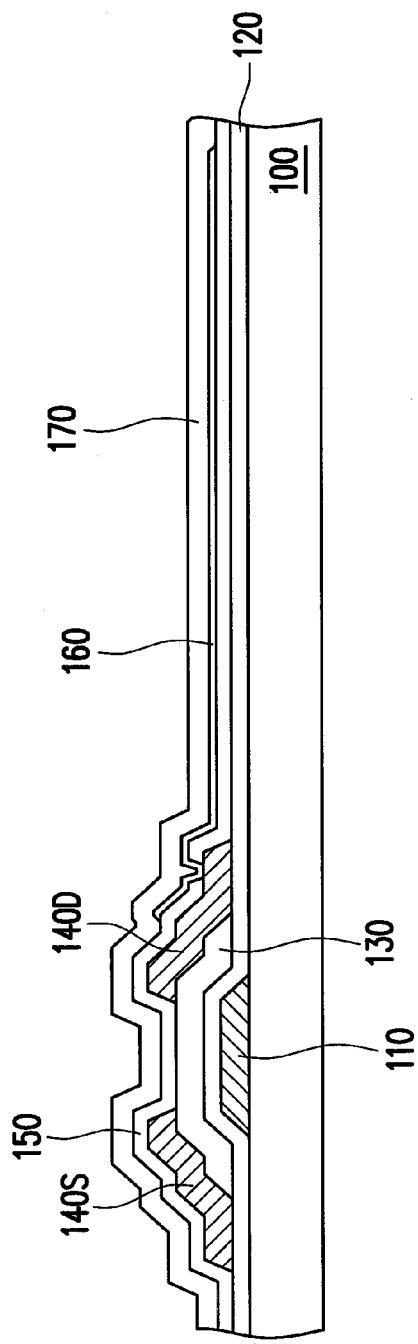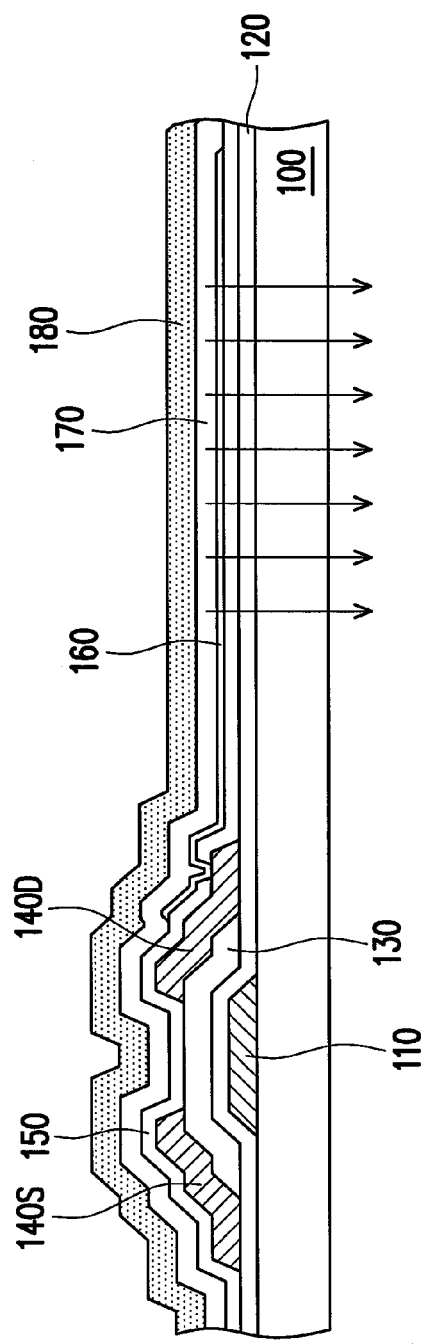
FIG. 1F (RELATED ART)
FIG. 1G (RELATED ART)

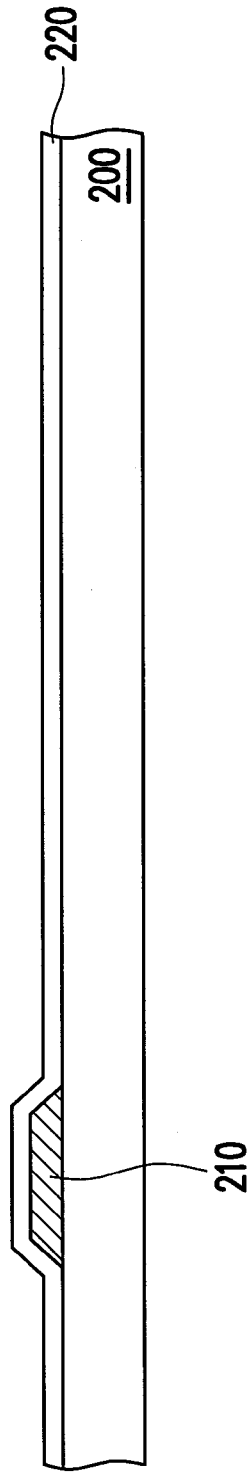
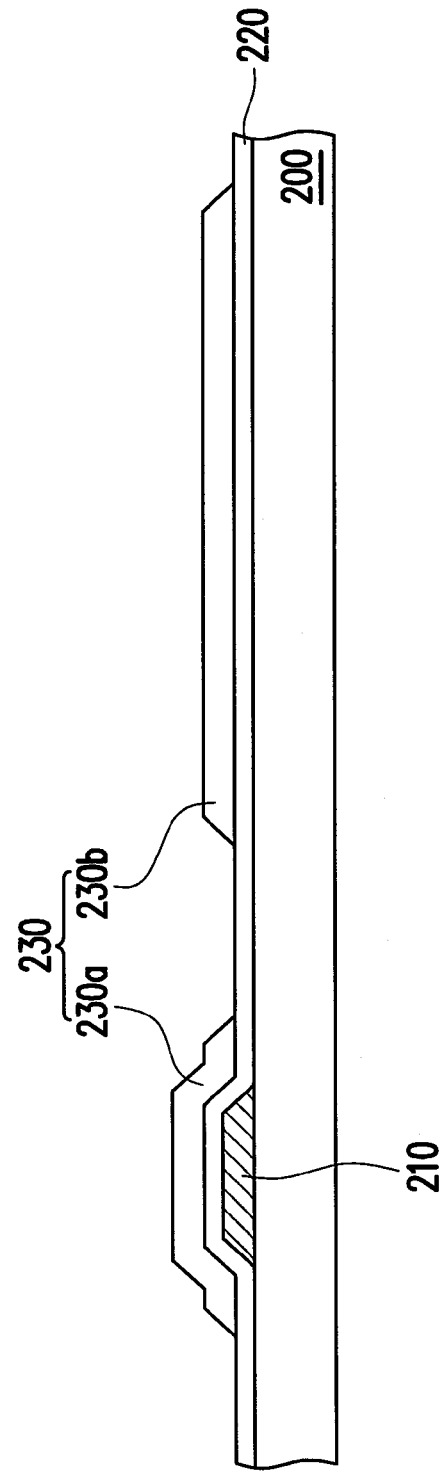

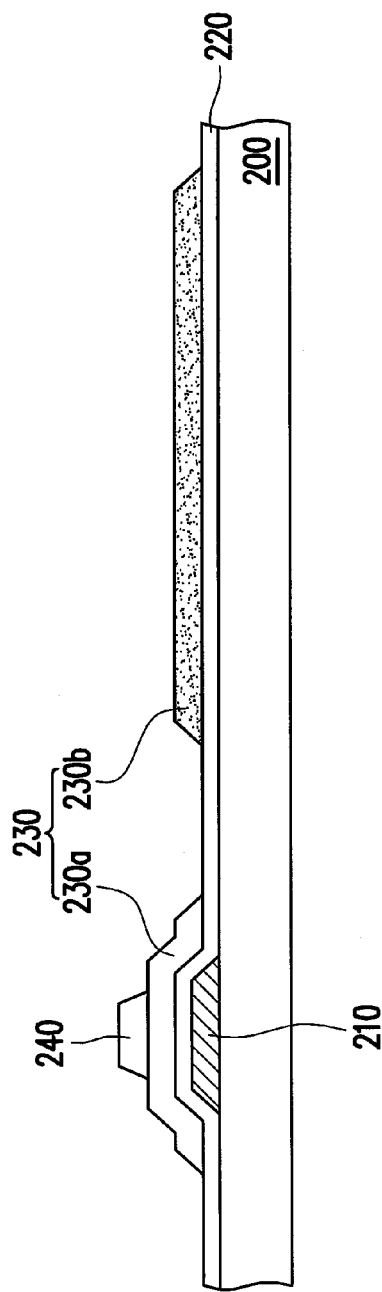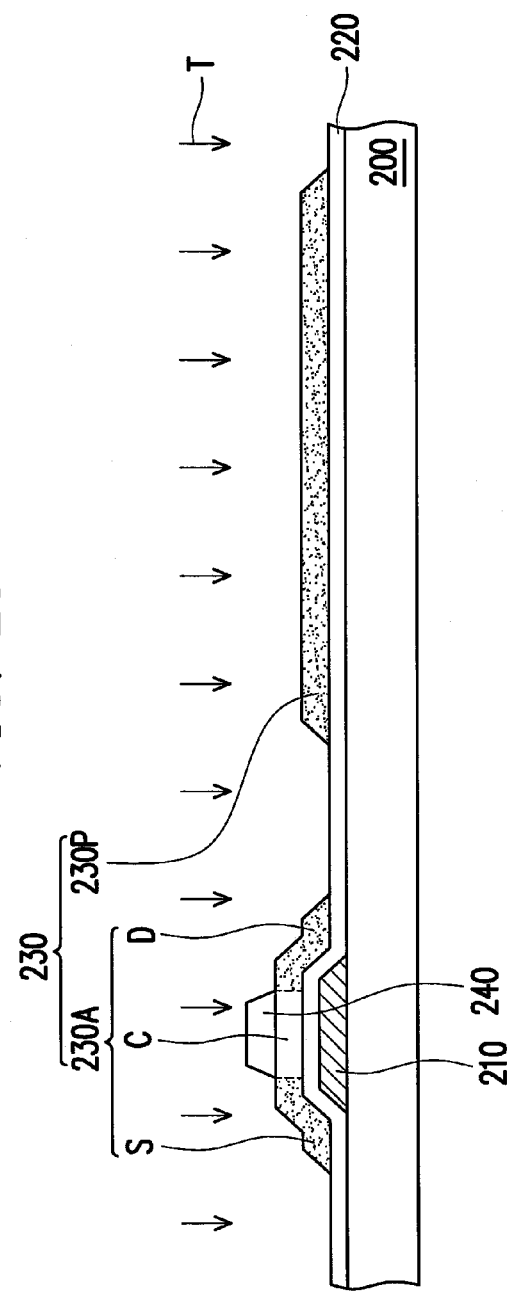

FABRICATING METHOD OF ORGANIC ELECTRO-LUMINESCENCE DISPLAY UNIT

CROSS-REFERENCE TO RELATED APPLICATION

This application is a divisional of and claims the priority benefit of U.S. application Ser. No. 12/582,711 filed on Oct. 21, 2009, now pending, which claims the priority benefit of Taiwan application serial no. 98125240, filed on Jul. 27, 2009. The entirety of each of the above-mentioned patent applications is hereby incorporated by reference herein and made a part of specification.

BACKGROUND OF THE INVENTION

1. Field of the Invention

The application relates to a pixel structure and a fabricating method thereof. More particularly, the application relates to an organic electro-luminescence display unit and a fabricating method thereof.

2. Description of Related Art

An organic electro-luminescence device is characterized by self-luminance, high brightness, high contrast, wide view angle, fast response speed, and so on. Therefore, among various displays, an organic electro-luminescence display panel frequently draws attention. In general, the organic electro-luminescence display panel can be classified into a top emission organic electro-luminescence display panel and a bottom emission organic electro-luminescence display panel, wherein the latter is more common.

FIGS. 1A to 1G are schematic cross-sectional views illustrating a fabricating process of a conventional organic electro-luminescence display unit. As indicated in FIG. 1A, a substrate 100 is provided, and a first photolithography and etching process (PEP) is performed to form a gate 110 on the substrate 100. Next, a gate insulating layer 120 is formed on the entire substrate 100 to cover the gate 110.

After that, as shown in FIG. 1B, a second PEP is performed to form a patterned semiconductor layer 130 on the gate insulating layer 120. Here, the patterned semiconductor layer 130 is located above the gate 110.

Thereafter, as indicated in FIG. 1C, a third PEP is performed to form a source 140S and a drain 140D on a portion of the patterned semiconductor layer 130 and a portion of the gate insulating layer 120. The source 140S and the drain 140D are electrically insulated from each other and located at respective sides of the patterned semiconductor layer 130.

In FIG. 1D, a passivation layer 150 is then formed to cover the source 140S, the drain 140D, the portion of the patterned semiconductor layer 130 uncovered by the source 140S and the drain 140D, and the portion of the gate insulating layer 120 uncovered by the source 140S and the drain 140D. It can be observed from FIG. 1D that the passivation layer 150 has a contact 150a exposing a portion of the drain 140D.

Afterwards, as indicated in FIG. 1E, a pixel electrode 160 is formed on the passivation layer 150. Here, the pixel electrode 160 is electrically connected to the drain 140D through the contact 150a. In the conventional bottom emission organic electro-luminescence display unit, the pixel electrode 160 is usually made of transparent conductive oxide (TCO), e.g., indium-tin oxide (ITO), indium-zinc oxide (IZO), and so forth.

Next, with reference to FIGS. 1F and 1G, after the pixel electrode 160 is formed, an organic electro-luminescence layer 170 and a top electrode 180 are sequentially formed. The top electrode 180 of the conventional bottom emission organic electro-luminescence display unit is often made of metal. When a driving current is applied to the organic electro-luminescence layer 170 located between the pixel electrode 160 and the top electrode 180, most light emitted from the organic electro-luminescence layer 170 passes through the substrate 100.

SUMMARY OF THE INVENTION

The application is directed to a pixel electrode and a fabricating method thereof for effectively reducing fabricating costs.

The application is also directed to an organic electro-luminescence display unit and a fabricating method thereof for effectively reducing fabricating costs.

In this application, a pixel structure disposed on a substrate is provided. The pixel structure includes a gate, a gate insulating layer, a patterned metal-oxide layer, an etching stop layer, a source, and a drain. The gate is disposed on the substrate. The gate insulating layer is disposed on the substrate to cover the gate. The patterned metal-oxide layer is disposed on the gate insulating layer and includes an active layer located above the gate and a pixel electrode. The etching stop layer is disposed on a portion of the active layer, wherein conductivity of a portion of the patterned metal-oxide layer uncovered by the etching stop layer is greater than conductivity of a portion of the patterned metal-oxide layer covered by the etching stop layer. Besides, the source and the drain are electrically connected to the portion of the active layer uncovered by the etching stop layer, and the drain is electrically connected to the pixel electrode.

According to an exemplary embodiment of the invention, oxygen vacancy ratio of the portion of the patterned metal-oxide layer uncovered by the etching stop layer is greater than oxygen vacancy ratio of the portion of the patterned metal-oxide layer covered by the etching stop layer.

According to an exemplary embodiment of the invention, conductivity of the portion of the active layer uncovered by the etching stop layer is substantially equal to conductivity of the pixel electrode.

According to an exemplary embodiment of the invention, oxygen vacancy ratio of the portion of the active layer uncovered by the etching stop layer is substantially equal to oxygen vacancy ratio of the pixel electrode.

According to an exemplary embodiment of the invention, the active layer includes a source contact region, a drain contact region, and a channel region connected between the source contact region and the drain contact region, and the etching stop layer is disposed on the channel region.

According to an exemplary embodiment of the invention, the etching stop layer is self-aligned to the channel region.

According to an exemplary embodiment of the invention, conductivities or oxygen vacancy ratios of the source, the drain, and the pixel electrode are substantially the same.

According to an exemplary embodiment of the invention, conductive carrier concentrations of the source, the drain, and the pixel electrode range from $10^{20}$ cm$^{-3}$ to $10^{21}$ cm$^{-3}$.

According to an exemplary embodiment of the invention, a material of the patterned metal-oxide layer includes indium-gallium-zinc oxide (IGZO), indium-zinc oxide (IZO), gallium-zinc oxide (GZO), zinc-tin oxide (ZTO), or indium-tin oxide (ITO).

According to an exemplary embodiment of the invention, the pixel structure further includes a passivation layer covering the etching stop layer, the source, the drain, and a portion of the pixel electrode. The passivation layer has an opening partially exposing a portion of the pixel electrode.

In this application, a fabricating method of a pixel structure is also provided. First, a gate is formed on a substrate, and a gate insulating layer is formed on the substrate to cover the gate. A patterned metal-oxide layer is then formed on the gate insulating layer, and an etching stop layer is formed on a portion of the patterned metal-oxide layer. Next, a surface treatment is performed on the patterned metal-oxide layer with use of the etching stop layer as a mask, such that conductivity of a portion of the patterned metal-oxide layer uncovered by the etching stop layer is greater than conductivity of a portion of the patterned metal-oxide layer covered by the etching stop layer. Here, the patterned metal-oxide layer treated by the surface treatment includes a pixel electrode and an active layer located above the gate. Thereafter, a source and a drain are formed. Here, the source and the drain are electrically connected to a portion of the active layer uncovered by the etching stop layer, and the drain is electrically connected to the pixel electrode.

According to an exemplary embodiment of the invention, the surface treatment includes a plasma surface treatment.

According to an exemplary embodiment of the invention, the fabricating method of the pixel structure further includes forming a passivation layer covering the etching stop layer, the source, the drain, and a portion of the pixel electrode. The passivation layer has an opening partially exposing a portion of the pixel electrode.

In this application, an organic electro-luminescence display unit is also provided. The organic electro-luminescence display unit is disposed on a substrate and includes a pixel unit, an organic electro-luminescence layer disposed on a pixel electrode, and a top electrode disposed on the organic electro-luminescence layer. The pixel unit includes a gate, a gate insulating layer, a patterned metal-oxide layer, an etching stop layer, a source, and a drain. The gate is disposed on the substrate. The gate insulating layer is disposed on the substrate to cover the gate. The patterned metal-oxide layer is disposed on the gate insulating layer and includes a pixel electrode and an active layer located above the gate. The etching stop layer is disposed on a portion of the active layer, wherein conductivity of a portion of the patterned metal-oxide layer uncovered by the etching stop layer is greater than conductivity of a portion of the patterned metal-oxide layer covered by the etching stop layer. Besides, the source and the drain are electrically connected to the portion of the active layer uncovered by the etching stop layer, and the drain is electrically connected to the pixel electrode.

In this invention, a fabricating method of an organic electroluminescent display unit is also provided. First, a gate is formed on a substrate, and a gate insulating layer is formed on the substrate to cover the gate. A patterned metal-oxide layer is then formed on the gate insulating layer, and an etching stop layer is formed on a portion of the patterned metal-oxide layer. Next, a surface treatment is performed on the patterned metal-oxide layer with use of the etching stop layer as a mask, such that a portion of the patterned metal-oxide layer uncovered by the etching stop layer has greater conductivity than conductivity of the portion of the patterned metal-oxide layer covered by the etching stop layer. Here, the patterned metal-oxide layer treated by the surface treatment includes a pixel electrode and an active layer located above the gate. Thereafter, a source and a drain are formed. Here, the source and the drain are electrically connected to a portion of the active layer uncovered by the etching stop layer, and the drain is electrically connected to the pixel electrode. After that, an organic electro-luminescence layer is formed on the pixel electrode, and a top electrode is formed on the organic electro-luminescence layer.

Based on the above, the surface treatment is performed to make different areas of the patterned metal-oxide layer have different conductive carrier concentrations according to the invention, and the active layer and the pixel electrode can be both formed on the gate insulating layer. Therefore, the invention is conducive to reduction of manufacturing costs.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

FIGS. 1A to 1G are schematic cross-sectional views illustrating a fabricating process of a conventional organic electro-luminescence display unit.

FIGS. 2A to 2F are schematic cross-sectional views illustrating a fabricating process of an organic electro-luminescence display unit according to an exemplary embodiment of the invention.

DESCRIPTION OF EMBODIMENTS

Figure 1A:
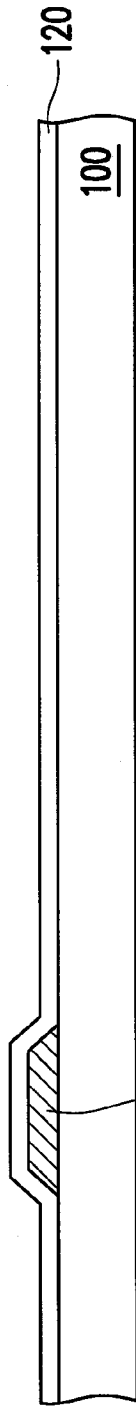
Figure 1B:
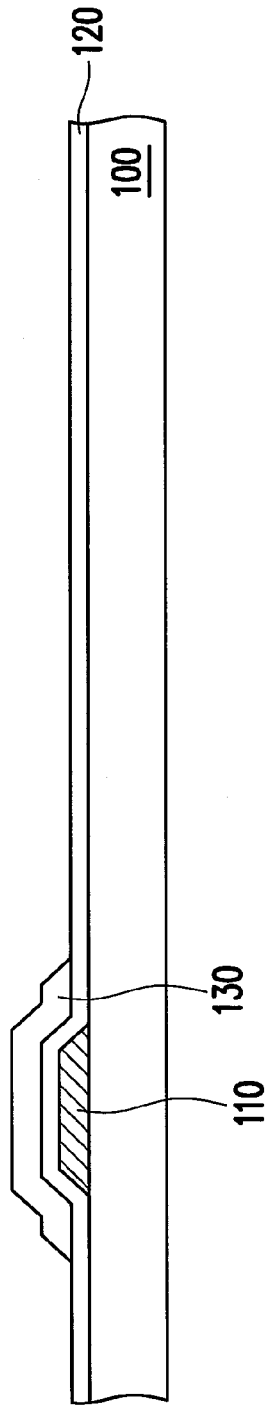
Figure 1C:
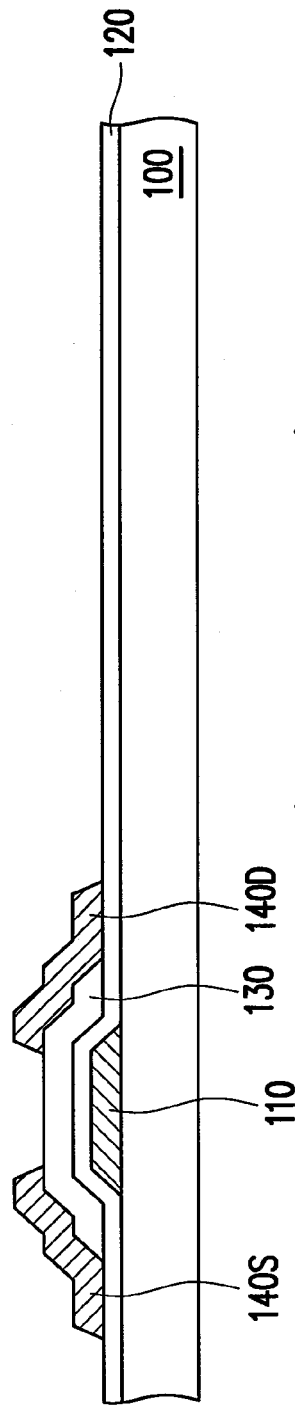
Figure 2E:
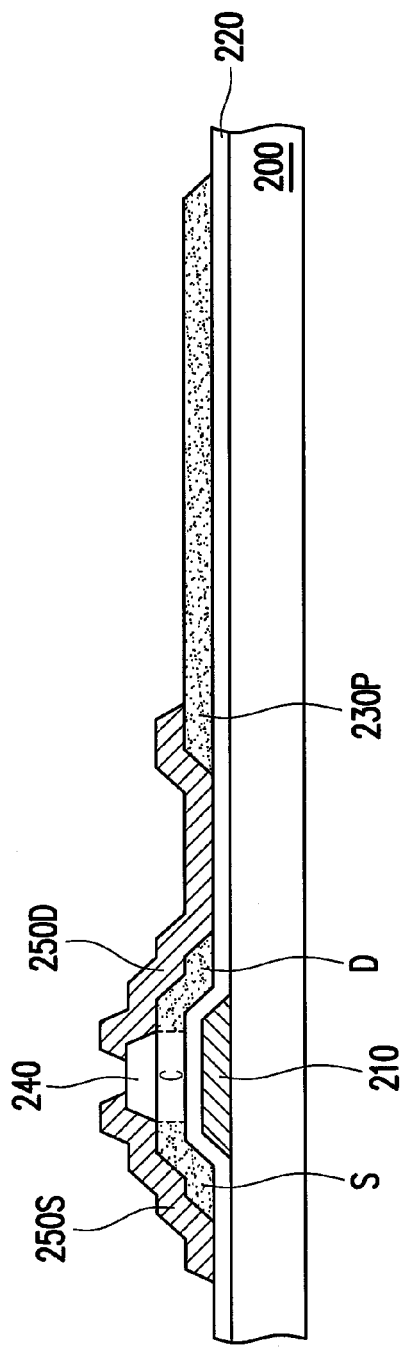

FIGS. 2A to 2F are schematic cross-sectional views illustrating a fabricating process of an organic electro-luminescence display unit according to an exemplary embodiment of the invention. As shown in FIG. 2A, a substrate 200 is provided, and a first photolithography and etching process (PEP) is performed to form a gate 210 on the substrate 200. Next, a gate insulating layer 220 is entirely formed on the substrate 200 to cover the gate 210. In this embodiment, the gate insulating layer 220 is made of, for example, silicon oxide, silicon nitride, and so on.

In FIG. 2B, a second PEP is then implemented to form a patterned metal-oxide layer 230 on the gate insulating layer 210. According to this embodiment, a material of the patterned metal-oxide layer 230 includes indium-gallium-zinc oxide (IGZO), indium-zinc oxide (IZO), gallium-zinc oxide (GZO), zinc-tin oxide (ZTO), or indium-tin oxide (ITO). It can be observed from FIG. 2B that the patterned metal-oxide layer 230 includes a first pattern 230a and a second pattern 230b located above the gate 210.

Next, as shown in FIG. 2C, an etching stop layer 240 is formed on the first pattern 230a of the patterned metal-oxide layer 230. Here, the etching stop layer 240 merely covers a portion of the first pattern 230a, and the etching stop layer 240 is located above the gate 210.

With reference to FIG. 2D, a surface treatment T is then performed on the patterned metal-oxide layer 230 by using the etching stop layer 240 as a mask, such that conductivity of a portion of the patterned metal-oxide layer 230 uncovered by the etching stop layer 240 is greater than that of a portion of the patterned metal-oxide layer 230 covered by the etching stop layer 240. In other words, oxygen vacancy ratio of the portion of the patterned metal-oxide layer 230 uncovered by the etching stop layer 240 is greater than oxygen vacancy ratio of the portion of the patterned metal-oxide layer 230 covered by the etching stop layer 240 after the surface treatment T is performed. In this embodiment, the surface treatment T is, for example, a plasma surface treatment or any other surface treatment which can contribute to an increase in conductive carrier concentration of the patterned metal-oxide layer 230. Specifically, the portion of the first pattern 230a covered by the etching stop layer 240 has conductivity or oxygen vacancy ratio which is not changed by the surface treatment T, while the second pattern 230b and the portion of the first pattern 230a uncovered by the etching stop layer 240 have conductivity or oxygen vacancy ratio which is changed by the surface treatment T.

For instance, when the plasma surface treatment is conducted, and the second pattern 230b and the portion of the first pattern 230a uncovered by the etching stop layer 240 suffer ion bombardment, bonds between metal ions and oxygen ions in the metal-oxide layer are damaged, and thereby oxygen vacancy ratio of the metal-oxide layer is increased. Namely, the conductive carrier concentration of the metal-oxide layer is increased along with an increase in oxygen vacancy ratio of the metal-oxide layer.

It can be known from FIG. 2D that the patterned metal-oxide layer 230 on which the surface treatment T is already performed includes a pixel electrode 230P and an active layer 230A that is located above the gate 210. The active layer 230A includes a source contact region S, a drain contact region D, and a channel region C connected between the source contact region S and the drain contact region D. The etching stop layer 240 is disposed on and self-aligned to the channel region C. Particularly, oxygen vacancy ratio of the portion of the active layer 230A uncovered by the etching stop layer 240 (i.e., the source contact region S and the drain contact region D) is substantially equal to that of the pixel electrode 230P. In other words, the portion of the active layer 230A uncovered by the etching stop layer 240 (i.e., the source contact region S and the drain contact region D) has conductivity substantially equal to that of the pixel electrode 230P. For instance, the conductive carrier concentrations of the source contact region S, the drain contact region D, and the pixel electrode 230P range from $10^{20}$ cm$^{-3}$ to $10^{21}$ cm$^{-3}$, and the conductive carrier concentration of the channel region C is $10^{14}$ cm$^{-3}$ approximately.

Referring to FIG. 2E, a source 250S and a drain 250D are formed. Here, the source 250S and the drain 250D are electrically connected to the portion of the active layer 230A uncovered by the etching stop layer 240. In detail, the source 250S is disposed on the source contact region S and a portion of the etching stop layer 240, while the drain 250D is disposed on the drain contact region D and another portion of the etching stop layer 240. Besides, the drain 250D is electrically connected between the drain contact region D and the pixel electrode 230P. After fabrication of the source 250S and the drain 250D, the pixel structure of this embodiment is completely formed.

As depicted in FIG. 2E, the pixel structure of this embodiment includes the gate 210, the gate insulating layer 220, the patterned metal-oxide layer 230, the etching stop layer 240, the source 250S, and the drain 250D. The gate 210 is disposed on the substrate 200. The gate insulating layer 220 is disposed on the substrate 200 to cover the gate 210. The patterned metal-oxide layer 230 is disposed on the gate insulating layer 220 and includes the pixel electrode 230P and the active layer 230A that is located above the gate 210. The etching stop layer 240 is disposed on a portion of the active layer 230A. Here, oxygen vacancy ratio of the portion of the patterned metal-oxide layer 230 uncovered by the etching stop layer 240 is greater than that of the portion of the patterned metal-oxide layer 230 covered by the etching stop layer 240. That is to say, conductivity of the portion of the patterned metal-oxide layer 230 uncovered by the etching stop layer 240 is greater than that of the portion of the patterned metal-oxide layer 230 covered by the etching stop layer 240. Additionally, the source 250S and the drain 250D are electrically connected to the portion of the active layer 230A uncovered by the etching stop layer 240, and the drain 250D is electrically connected to the pixel electrode 230P.

Figure 2F:
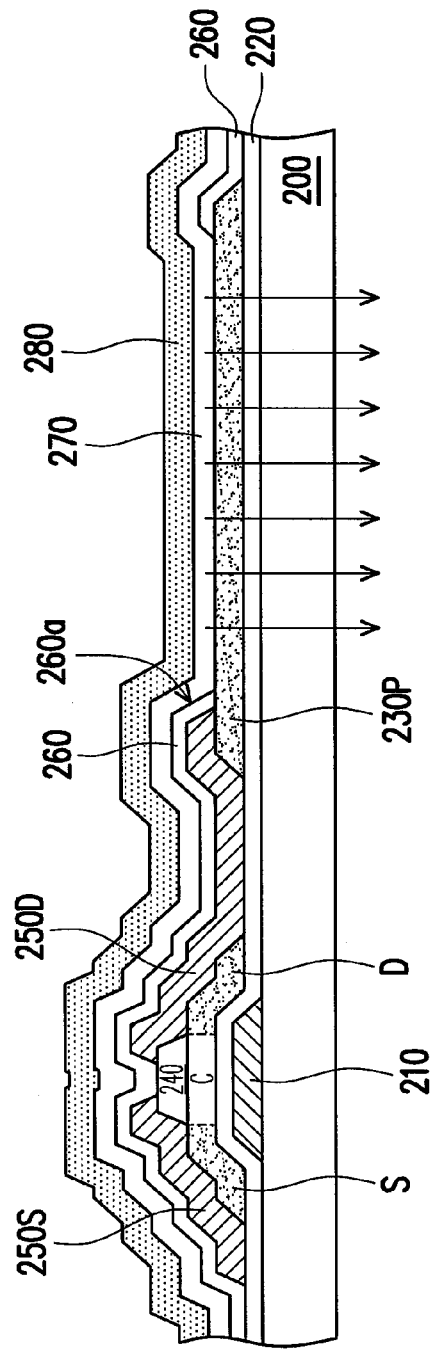

With reference to FIG. 2F, a passivation layer 260 is then formed to cover the etching stop layer 240, the source 250S, the drain 250D, and a portion of the pixel electrode 260. Here, the passivation layer 260 has an opening 260a partially exposing a portion of the pixel electrode 230P. After formation of the passivation layer 260, an organic electro-luminescence layer 270 and a top electrode 280 are sequentially formed. In this embodiment, the top electrode 280 is made of metal, for example. When a driving current is applied to the organic electro-luminescence layer 270 located between the pixel electrode 230P and the top electrode 280, most light emitted from the organic electro-luminescence layer 270 passes through the substrate 200. After fabrication of the top electrode 280, the organic electro-luminescence display unit of this embodiment is completely formed.

It can be known from FIG. 2F that the organic electro-luminescence display unit of this embodiment includes the pixel unit depicted in FIG. 2E, the organic electro-luminescence layer 270 disposed on the pixel electrode 230P, and the top electrode 280 disposed on the organic electro-luminescence layer 270.

In light of the foregoing, the surface treatment is performed to make different areas of the patterned metal-oxide layer have different conductive carrier concentrations according to the invention, and the active layer and the pixel electrode can be both formed on the gate insulating layer. Therefore, the invention is conducive to reduction of manufacturing costs.

What is claimed is:

1. A fabricating method of an organic electro-luminescence display unit, comprising:

forming a gate on a substrate;

forming a gate insulating layer on the substrate to cover the gate;

forming a patterned metal-oxide layer on the gate insulating layer;

forming an etching stop layer on a portion of the patterned metal-oxide layer;

performing a surface treatment on the patterned metal-oxide layer with use of the etching stop layer as a mask, such that conductivity of a portion of the patterned metal-oxide layer uncovered by the etching stop layer is greater than conductivity of the a portion of the patterned metal-oxide layer covered by the etching stop layer, wherein the patterned metal-oxide layer treated by the surface treatment comprises a pixel electrode and an active layer located above the gate insulation layer;

forming a source and a drain, wherein the source and the drain are electrically connected to a portion of the active layer uncovered by the etching stop layer, and the drain is electrically connected to the pixel electrode;

forming an organic electro-luminescence layer on the pixel electrode; and forming a top electrode on the organic electro-luminescence layer.

2. The fabricating method as claimed in claim 1, wherein the surface treatment comprises a plasma surface treatment.

* * * * *